United States Patent [19]

Suzuki et al.

[11] 4,217,502
[45] Aug. 12, 1980

[54] CONVERTER PRODUCING THREE OUTPUT STATES

[75] Inventors: Yasoji Suzuki, Ayase; Ryuzo Shiraki, Tokyo, both of Japan

[73] Assignee: Tokyo Shibaura Denki Kabushiki Kaisha, Japan

[21] Appl. No.: 941,256

[22] Filed: Sep. 11, 1978

[30] Foreign Application Priority Data

Sep. 10, 1977 [JP] Japan ................. 52-109138
Sep. 10, 1977 [JP] Japan ................. 52-109139
Oct. 26, 1977 [JP] Japan ................. 52-128297

[51] Int. Cl.² ............... H03K 19/20; H03K 19/08; H03K 17/04
[52] U.S. Cl. .................. 307/205; 307/209; 307/251; 307/270; 307/DIG. 1
[58] Field of Search ........... 307/205, 209, 215, 251, 307/246, 270, DIG. 1

[56] References Cited

U.S. PATENT DOCUMENTS

| | | | |
|---|---|---|---|
| T955,006 | 2/1977 | Cavaliere et al. | 307/205 X |
| 3,675,144 | 7/1972 | Zuk | 307/205 X |
| 3,911,289 | 10/1975 | Takemoto | 307/214 X |
| 3,912,947 | 10/1975 | Buchanan | 307/209 X |
| 3,916,430 | 10/1975 | Heuner et al. | 307/DIG. 1 X |
| 3,949,242 | 4/1976 | Hirasawa et al. | 307/209 X |
| 3,976,984 | 8/1976 | Hirasawa | 307/205 X |
| 4,037,114 | 7/1977 | Stewart et al. | 307/209 X |
| 4,080,539 | 3/1978 | Stewart | 307/270 X |
| 4,100,429 | 7/1978 | Adachi | 307/209 X |
| 4,161,040 | 7/1979 | Satoh | 307/209 X |

OTHER PUBLICATIONS

Suzuki, "CMOS Application Technique," pp. 26-28, 11/30/76.
RCA Catalog, "CMOS/MOS Integrated Circuits," p. 70, 1977 Edition.
Motorola Catalog, "Semiconductor Data Library," 1976 Edition, pp. 5-239.

*Primary Examiner*—Larry N. Anagnos
*Attorney, Agent, or Firm*—Finnegan, Henderson, Farabow, Garrett & Dunner

[57] ABSTRACT

An output circuit is provided in which a first IG-FET of a first conductivity type is connected between a first potential supply terminal and an output terminal and having its substrate controlled by a third potential higher than the first potential of the first potential supply terminal and a second IG-FET of a second conductivity type connected between a second potential supply terminal having a second potential lower than the first potential and the output terminal and having its substrate electrode supplied with the second potential. A control circuit is further provided which receives an input signal and control signal and controls the output circuit to permit the latter to produce one of the first potential, second potential and high impedance state. The output circuit and control circuit are combined to provide a converter circuit for converting the level of a CML (complementary MOS Transistor Logic) to a TTL (Transistor-Transistor Logic). A compensation circuit is further provided which, when a potential on the output terminal is shifted from the second potential to the first potential, permits a rise of the second potential to be sharpened. The compensation circuit includes a third IG-FET of a second conductivity type connected between the first potential supply terminal and the output terminal.

10 Claims, 9 Drawing Figures

CONVERTER PRODUCING THREE OUTPUT STATES

BACKGROUND OF THE INVENTION

This invention relates to a converter for effecting a potential level conversion, and in particular to a converter whose output terminal can take a first level state, second level state and high impedance output state.

There is a demand for a converter for converting a logic level (for example, H=+10V, L=0V) of a CMOS (complementary MOS) to a logic level (for example, H=+5V, L=0V) of a DTL (diode transistor logic) or a TTL (transistor transistor logic). In this case, it is preferable that the converter can take a HIGH output (H=+5V) state, LOW output (L=0V) state and high impedance output state. When the output of the converter is shifted from low level (L=0) to high level (H=+5V), a sharp rise of a signal on the output terminal of the converter is particularly required. Where such a converter is constituted using IG-FET's (insulated gate field effect transistors), the IG-FET is connected between a potential supply terminal for supplying a TTL level of, for example, +5V and an output terminal. Where, however, a converter is constituted using an integrated circuit, a potential level (for example, +10V) equal to a CMOS logic level is applied to a substrate of the IG-FET. In consequence, the threshold voltage of the IG-FET varies dependent upon a back gate bias effect, and a rise or fall (hereinafter referred to merely as a "rise") of the leading edge of the converter output is affected.

For ease in understanding the nature of this invention a converter circuit constituting part of this invention will be explained by referring to FIG. 1.

In FIG. 1, an input signal IN(H=10V, L=0V) from an input terminal 1 is supplied to one input of a NAND gate 2 and NOR gate 3. A control signal EN(H=+10V, L=0V) is supplied to the other input of NAND gate 2 and a negation signal $\overline{EN}$ is supplied to the other input of NOR gate 3. A first IG-FET 6 of P-channel type is arranged together with a second IG-FET 7 of an N-channel type. The output of NAND gate 2 is supplied to the gate of the first IG-FET 6 and the output of NAND gate 3 is supplied to the gate of the second IG-FET 7. The source of the first IG-FET 6 is connected to a supply terminal 8 of a first potential $V_{CC}$ (for example, +5v) and the drain of the first IG-FET 6 is connected to an output terminal 9. The source of IG-FET 7 is connected to a second potential (for example, 0V) supply terminal E, and the drain of IG-FET 7 is connected to the output terminal 9. The substrate electrode of IG-FET 6 is connected to a supply terminal 10 for supplying a third potential $V_{DD}$(+10V), and the substrate electrode of IG-FET 7 is connected to the second potential supply terminal E. For example, NAND gate 2 is shown in FIG. 2 and NOR gate 3 is shown in FIG. 3.

In FIG. 1, when EN=0V, the output of NAND gate 2 is +10V and the output of NOR gate 3 is 0V. Thus, IG-FET's 6 and 7 are rendered OFF and the output terminal 9 becomes a high impedance state. When EN=+10V and IN=+10V, the output of NAND gate 2 is 0V and the output of NOR gate 3 is 0V. Thus, IG-FET 6 is rendered ON and IG-FET 7 is rendered OFF. As a result, the output terminal 9 becomes a +5V output state. Stated in another way, the level +10V of the input signal IN is converted to a level of +5V.

When IN=0V at EN=+10V, the output of NAND gate 2 becomes +10V and the output of NAND gate 3 becomes +10v. Thus, IG-FET 6 is rendered OFF and IG-FET 7 is rendered ON. In consequence, the output terminal 9 becomes a "0V" output state.

As set out above, a voltage (10V) higher than the source potential (+5V) is applied to the substrate electrode of IG-FET 6. In consequence, IG-FET 6 is in the so-called "back gate bias" state. Since the threshold voltage of IG-FET 6 is increased i.e. the gate-to-source voltage is decreased, the output current of IG-FET 6 is decreased. For this reason, a rise time of the output voltage is lengthened when a potential on the output terminal 9 is shifted from 0V to +5V.

It is accordingly the object of this invention to provide a converter capable of producing three output states, which converter includes a compensation circuit which permits a rise of the leading edge of the converter output to be sharpened.

SUMMARY OF THE INVENTION

This invention includes a converter circuit and compensation circuit. The converter circuit comprises a first supply terminal for supplying a first potential, a second potential supply terminal for supplying a second potential smaller in absolute value than that of the first potential, a first IG-FET means including at least one IG-FET of a first conductivity type series-connected between the first potential supply terminal and the output terminal and having its substrate electrode supplied with a third potential having an absolute value greater than that of the first potential, a second IG-FET means including at least one IG-FET of a second conductivity type series-connected between the second potential supply terminal and the output terminal and having its substrate electrode supplied with the second potential, and control means receptive to an input signal and at least one control signal and adapted to control the first and second IG-FET means such that three output states, i.e. the first potential state, second potential state and high impedance state, can appear on the output terminal. The compensation circuit includes at least one IG-FET of second conductivity type series-connected between the first potential supply terminal and the output terminal and having its substrate electrode connected to the output terminal, and adapted to be controlled by the control means such that, when a potential on the output terminal is shifted from the second potential to the first potential, a sharp rise is imparted to a signal corresponding to the first potential.

BRIEF DESCRIPTION OF THE DRAWINGS

This invention will be further described by way of example by referring to the accompanying drawings in which.

DETAILED DESCRIPTION OF THE PREFERRED EMBODIMENTS

Figure 1:
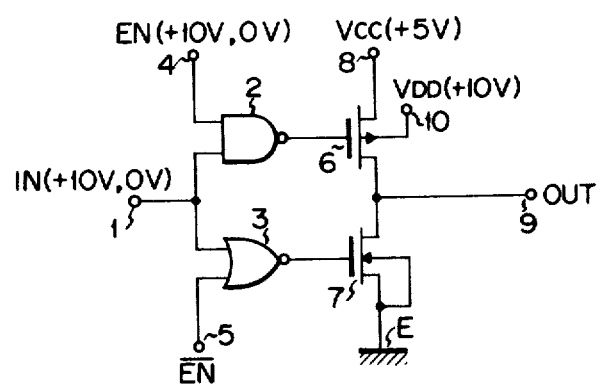
FIG. 1 is a circuit diagram showing a converter circuit capable of producing three output states.
Figure 4:
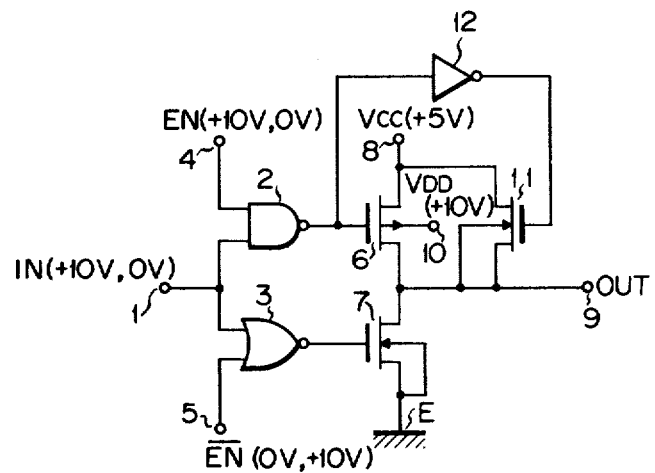
FIGS. 4 to 9 are circuit diagrams showing a first to a sixth embodiments of this invention.

The function and operation of a converter circuit comprising, as shown in FIG. 4, a NAND gate 2, NOR gate 3, first IG-FET 6 of a first conductivity type and second IG-FET 7, of a second conductivity type have already been explained in connection with FIG. 1. The first embodiment of FIG. 4 is characterized in that a third IG-FET 11 of a second conductivity type (in this case, N-channel type) is provided. The IG-FET 11 has its source connected to an output terminal 9, its drain connected to a first potential supply terminal 8, its substrate electrode connected to the output terminal 9, and its gate connected through an inverter 12 to the output terminal of a NAND gate 2 so that an output of the inverter is supplied to the gate of IG-FET 11.

When $EN = +10V$ and $IN = 0V$, IG-FET 6 is in the OFF state and IG-FET 7 is in the ON state and thus the output terminal 9 is in the 0V state. This has already been explained in connection with FIG. 1. When $IN = +10V$ at $EN = +10V$, on the other hand, a potential on the output terminal 9 goes from 0V to $+5V$. At $EN = +10V$ and $IN = +10V$ the output of the NAND gate 2 becomes 0V and IG-FET 11 become an ON state upon receipt of an output $+10V$ from inverter 12. What is important to note here is that a potential on the output terminal 9 is 0V, not $+5V$, at the moment when $EN = +10V$ and $IN = +10V$. Thereafter, a gate-to-source voltage of IG-FET 11 becomes very larger and the output current of IG-FET 11 becomes sufficiently larger. In consequence, IG-FET 11 can sufficiently compensate for a decrease of an output current resulting from a back gate bias effect of the first IG-FET 6. When a load, for example a succeeding stage IG-FET, is connected to an output terminal 9, a sharp rise of output voltage can be obtained from the output terminal 9.

Figure 5:
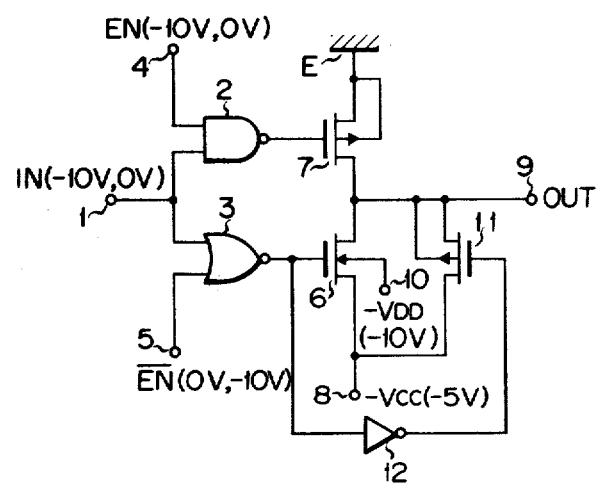

While the above-explanation has been directed to obtaining a positive voltage level output, this invention can also be applied to a converter for obtaining a negative voltage level output, as shown in FIG. 5. The embodiment of FIG. 5 is the same as that of FIG. 4 in that an input signal $IN(-10V, 0V)$ is supplied to one terminal of a NAND gate 2 and of NOR gate 3 and that a control signal $EN(-10V, 0v)$ is supplied to the other input terminal of NAND gate 2 and a negation signal $\overline{EN}$ as opposed to the control signal EN is supplied to the other input terminal of NOR gate 3. A first IG-FET 6 of an N-channel type is connected between a first potential supply terminal 8 and an output terminal 9; a second IG-FET 7 of a P-channel type is connected between a second potential supply terminal E and the output terminal 9; and a third IG-FET 11 of P-channel type is connected between the first potential supply terminal 8 and an output terminal 9. A first potential $-V_{cc} = -5V$ is applied to the source of IG-FET 6 and a third potential $-V_{DD} = -10V$ is applied to the substrate of IG-FET 6. An earth potential is applied to the source and substrate electrode of IG-FET 7. The source and substrate electrode of IG-FET 11 are connected to the output terminal 9; the drain of IG-FET 11 is connected to the first potential supply terminal 8; and the gate of IG-FET 11 is connected to the output terminal of NOR gate 3 through an inverter 12 which is connected to permit an inverted output to be supplied to the gate of IG-FET 11.

The embodiment of FIG. 5 will now be explained in a positive logic in which EN and IN are represented by $H = 0V$ and $L = -10V$, respectively.

In FIG. 5, with $EN = L$-level $(-10V)$, the output of NAND gate 2 becomes a H-level (0V) and the output of NOR gate 3 becomes a L-level $(-10V)$. Thus, IG-FET 7, IG-FET 6 and IG-FET 11 are all rendered OFF and the output terminal 9 becomes a high impedance state. When $EN = H$-level (0V) and $IN = L$-level $(-10V)$, the output of NAND gate 2 becomes a H-level (0V) and the output of the NOR gate 3 becomes a H-level (0V). In consequence, IG-FET 7 is rendered OFF and IG-FET's 6 and 11 are rendered OFF and a potential level on the output terminal 9 becomes $-5V$. This means that the $-10V$ IN level has been converted to a $-5V$ level. When $EN = H$-level (0V) and $IN = H$-level (0V), the output of NAND gate 2 becomes a L-level $(-10V)$ and the output of NOR gate 3 a L-level $(-10V)$. Thus, IG-FET 7 is rendered ON and IG-FET's 6 and 11 are both rendered OFF and a potential level on the output becomes a H-level (0V). Even in this embodiment, the moment the potential level on the output terminal 9 is shifted from a 0V level to a $-5V$ level it is still in substantially zero state and thus a gate-to-source potential of IG-FET 11 is greater. For this reason, IG-FET 11 attains a rapid conduction to permit a sharp rise of the output signal.

In the embodiment shown in FIGS. 4 and 5 a control signal is applied through the inverter 12 to the gate of IG-FET 11. The output of the inverter 12 is produced after time-delayed with respect to the input thereof. If such a time delay is relatively great, it would be difficult, in the embodiments of FIGS. 4 and 5, to make IG-FET 11 conductive simultaneously with the conduction of IG-FET 6. In consequence, it would be difficult to sufficiently improve a rise of a signal on the output terminal 9. If the delay time of the inverter 12 is made sufficiently smaller, the object of this invention can be sufficiently attained.

Figure 6:
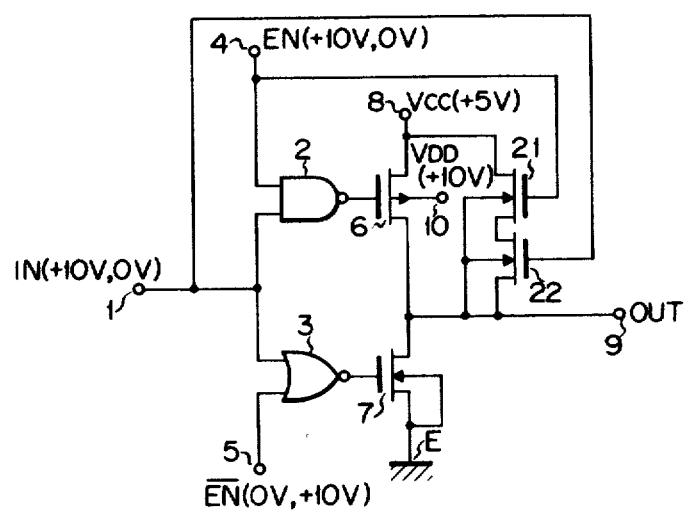

In an embodiment of FIG. 6 a compensation circuit is constructed without using any inverter. This permits a rise of a signal on the output terminal 9 to be more sharpened. The FIG. 6 converted circuit comprising NAND gate 2, NOR gate 3, first IG-FET 6 of a P-channel type, and second IG-FET 7 of an N-channel type is exactly the same as the embodiment shown in FIG. 4 and further explanation is therefore omitted. Now only the compensation circuit will be explained below.

The compensation circuit in FIG. 6 includes third and fourth IG-FET's 21 and 22 of an N-channel type which are series-connected between the first potential supply terminal 8 and the output terminal 9. The substrate electrodes of FET's 21 and 22 are connected to an output terminal 9, the drain of IG-FET 21 is connected to the first potential supply terminal 8, and the source of IG-FET 22 is connected to the output terminal 9. The gate of IG-FET 21 is connected to a control signal EN input terminal 4 and the gate of IG-FET 22 is connected to an input signal IN input terminal.

When $EN = 0V(L)$, the output of a NAND gate 2 is $+10V(H)$ and the output of a NOR gate 3 is $0V(L)$. Thus, IG-FET's 6, 7, 21 and 22 are rendered OFF and the output terminal 9 becomes a high impedance state. When $IN = +10V(H)$ at $EN = +10V$, the output of NAND gate 6 becomes $0V(L)$ and the output of NOR gate 7 becomes $0V(L)$. Thus, IG-FET's 6, 21 and 22 are all rendered ON, whereas IG-FET 7 is rendered OFF. As a result, a potential on the output terminal 9 is shifted from 0V to +5V. Since in this case a control signal EN and input signal IN are supplied directly to IG-FET's 21 and 22, respectively, IG-FET's 6, 21 and 22 all rendered ON. The potential on the output terminal 9, immediately before shifted from 0V(L) to +5V(H), is substantially zero, the gate-to-source voltage of IG-FET 22 becomes (10V−VthN) wherein VthN denotes a threshold voltage of the N-channel IG-FET, and the output current of the compensation circuit becomes substantially greater. Since a back gate bias is applied to IG-FET 6, the output current is increased. The decrease of the output current of FET 6 is sufficiently compensated by the current flowing through the IG-FET's 21 and 22. Thus a rise of a signal on the output terminal 9 to which the other IG-FET is connected can be sufficiently improved. Experiments and circuit analysis prove that if the size (channel width/ channel length) of IG-FET is calculated in terms of a single IG-FET, an improvement in the rise of a signal on the output terminal 9 can be obtained with about one-fifth the size of the single IG-FET 11 of FIG. 4.

Figure 2:
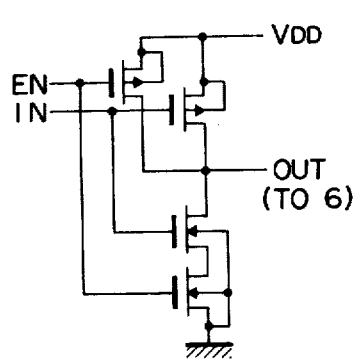
FIG. 2 shows one example of a NAND gate of FIG. 1.
Figure 3:
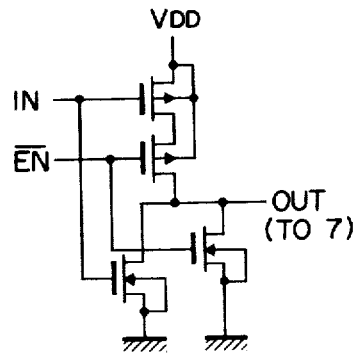
FIG. 3 shows one example of a NOR gate of FIG. 1.

NAND gate 2 and NOR gate 3 are not restricted to those shown in FIGS. 2 and 3. It will be apparent that where a section for generating a negation signal $\overline{EN}$, as opposed to a control signal EN, is included in NAND gate or NOR gate, it is only necessary to input an input signal IN and a single control signal EN. Although the above-mentioned explanation is directed to the case where IG-FET 21 is rendered nonconductive when the output terminal is at the high impedance state, a variation can be made such that IG-FET 22 is rendered non-conductive and IG-FET's 21 and 22 are both rendered conductive.

Figure 7:
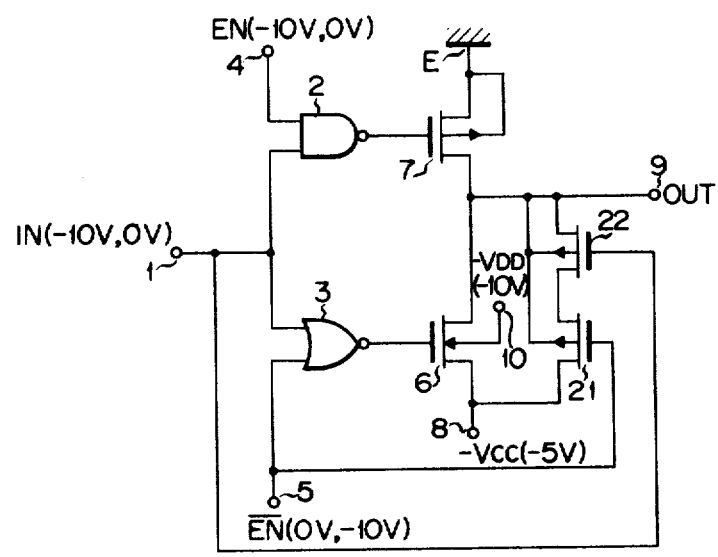

In an embodiment of FIG. 7 is shown a negative level output circuit corresponding to FIG. 6. In FIG. 7 the source of a first IG-FET 6 of an N-channel type is connected to a first potential ($-V_{CC}=-5V$) supply terminal 8, the substrate electrode of IG-FET 6 is connected to a third potential ($-V_{DD}=-10V$) supply terminal 10 and the gate of IG-FET 6 is connected to the output terminal of a NOR gate 3. The source and substrate electrode of a second IG-FET 7 of a P-channel type are connected to a second potential (ground level) supply terminal E, the drain of IG-FET 7 is connected to the drain of IG-FET 6 and the gate of IG-FET 7 is connected to the output terminal of NAND gate 2. An output terminal 9 is connected between the drains of IG-FET's 6 and 7. A compensation circuit includes third and fourth IG-FET's 21 and 22 of a P-channel type which are connected in series to each other. The drain of FET 21 is connected to the terminal 8, the substrate electrode of FET 21 is connected to the output terminal 9 and the gate of FET 21 is connected to a terminal 5. The source and substrate electrode of FET 22 are connected to the output terminal 9, the drain of FET 22 is connected to the source of FET 21 and the gate of FET 22 is connected to a terminal 1.

In FIG. 7, when EN=−10V the output of NAND gate 2 is 0V and the output of NOR gate 3 is −10V. Thus, IG-FET's 6, 7 and 21 are all rendered OFF. As a result, the output terminal 9 is at high impedance state. When EN=0V(H) and IN=−10V(L), the output of NAND gate 2 is 0V(H) and the output of NOR gate 3 is 0V(H). Thus, IG-FET 7 is rendered OFF, while IG-FET's 6, 21 and 22 are rendered ON. As a result, a potential on the output terminal 9 is −5V. When EN=0V and IN=0V, the output of NAND gate 2 is −10V and the output of NOR gate 3 is −10V. Thus, IG-FET's 6 and 22 are rendered OFF, while IG-FET's 7 and 21 are rendered ON. As a result, a potential on the output terminal 9 is 0V. Even in this embodiment, a rise of a signal on the output terminal 9 can be improved, since the gate of IG-FET's 21 and 22 are connected directly to the terminals 5 and 1, respectively and since the potential on the terminal 9, immediately before shifted from 0V to −5V, is substantially 0V and thus the source-to-gate potential of IG-FET 22 is very greater. Therefore, the rise from 0V to −5V of the signal on the output terminal 9 is shapened.

The control means of the converter circuit as shown in FIGS. 4 to 7 is of a relatively complicated configuration including NAND and NOR gates. In contrast, FIGS. 8 and 9 show embodiments having a simplified control means.

Figure 8:
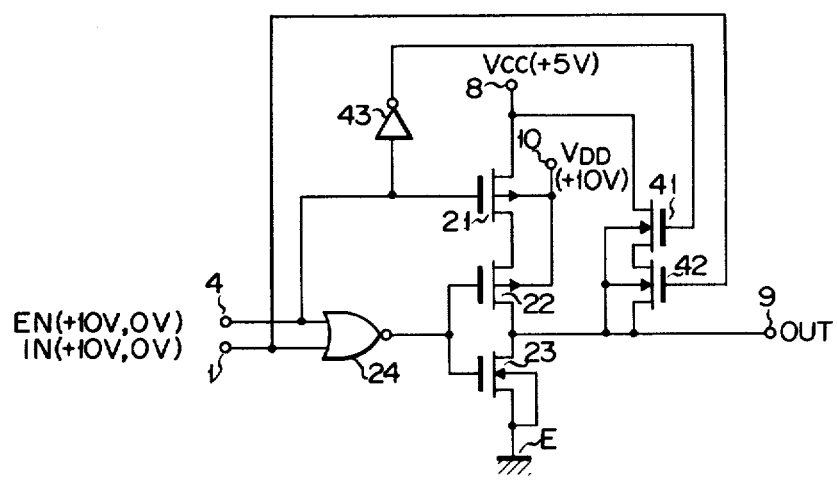

In the embodiment shown in FIG. 8 the source of a first IG-FET 21 of P-channel type is connected to a first potential (+5V) supply terminal 8 and the substrate electrode is connected to a second potential (+10V) supply terminal 10. The source of a second IG-FET 22 of P-channel type is connected to the drain of IG-FET 21, the substrate electrode of IG-FET 22 is connected to the third potential (+10V) supply terminal and the drain of IG-FET 22 is connected to the output terminal 9. The source and substrate electrode of third IG-FET 23 of N-channel type are connected to a second potential E (0V in this embodiment) and the drain of IG-FET 23 is connected to an output terminal 9. The control means includes a NOR gate 24 to which a control signal EN and input signal IN are supplied respectively through terminals 4 and 1. The output of NOR gate 24 is supplied to the gates of IG-FET's 22 and 23 and a control signal EN is supplied directly to the gate of IG-EFT 21. The compensation circuit includes fourth and fifth IG-FET's 41 and 42 of an N-channel type and an inverter 43. The drain of FET 41 is connected to the terminal 8, the source of IG-FET 41 is connected to the drain of FET 42, the substrate electrode of IG-FET 41 is connected to the output terminal 9 and the gate of IG-FET 41 is connected to the control terminal 4 through an inverter 43. The output of the inverter 43 is connected to the gate of IG-FET 41. The source and substrate electrode of IG-FET 42 are connected to the output terminal 9 and the gate of IG-FET 42 is connected directly to the input signal terminal 1.

When EN=+10V and IN=+10V, IG-FET's 22 and 42 are rendered ON and IG-FET's 21, 23 and 41 are rendered OFF. Thus, the output terminal 9 becomes a high impedance state. When EN=0 and IN=+10V, IG-FET's 21, 41 and 42 are rendered ON and the output of NOR gate 24 is 0V(L). Thus, IG-FET 22 is in the ON state and IG-FET 23 is in the OFF state. In consequence, a potential on the output terminal 9 is +5V. When EN=0V and IN=0V, IG-FET's 21 and 41 are rendered ON, IG-FET 42 is rendered OFF and the output of NOR gate 24 is +10V. Thus, IG-FET 22 is rendered OFF and IG-FET 23 is rendered ON. Thus, a potential on the output terminal 9 becomes 0V. Since the potential on the output terminal 9, immediately before shifted from 0V to 5V, is substantially 0V, the source-to-gate potential of IG-FET 42 is greater and thus electric current rapidly flows through the compensation circuit. In consequence, a rise of the signal on the output terminal can be improved. A control signal EN is supplied through the inverter 43 to the gate of FET 41. Therefore, even when EN becomes 0V and a +10V control signal is applied to the gate of FET 41, if the inverter 43 involves a greater delay time, a commencement of conduction of IG-FET 41 is delayed. In consequence, the delay time of the inverter 43 needs to be made as small as possible.

Figure 9:
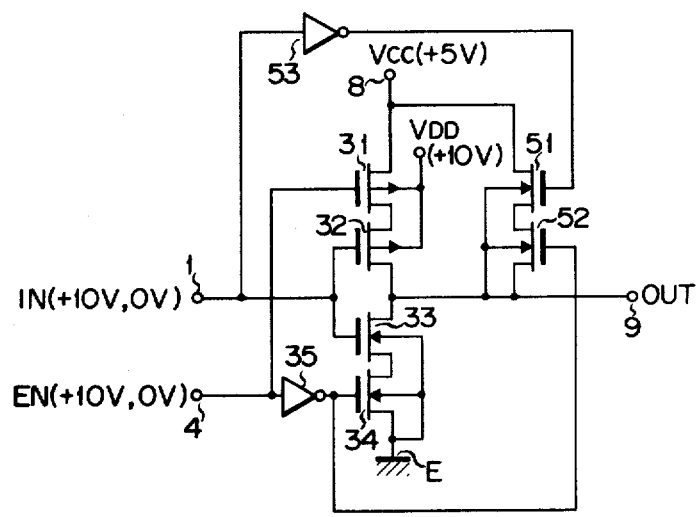

In the embodiment shown in FIG. 9, the connections of first and second IG-FET's 31 and 32 (P-channel type) to a first potential supply terminal 8, to third potential supply terminal 10 and to output terminal 9 are exactly the same as that of FIG. 8, and any further explanation is omitted. However, the source of a third IG-FET 33 (N-channel type) whose drain is connected to an output terminal 9 is connected to the drain of a fourth, IG-FET 34 of an N-channel type, and the source of IG-FET 34 is connected to a second potential (0V) supply terminal E. The substrate electrodes of IG-FET's 33 and 34 are connected to a second potential supply terminal E. A control circuit signal EN of the converter circuit is supplied directly to the gate of IG-FET 31 and through an inverter 35 to the gate of IG-FET 34. An input signal IN is supplied to the gates of IG-FET's 32 and 33. The compensation circuit includes fifth and sixth IG-FET's 51 and 52 series-connected as were IG-FET's 41 and 42 in the embodiment of FIG. 8. The source of IG-FET 52 is connected to the output terminal 9, the drain of IG-FET 51 is connected to a first potential supply terminal 8 and the substrate electrodes of IG-FET's 51 and 52 are connected to the output terminal 9. This connection is the same as that of FIG. 8. However, the gate of IG-FET 51 is connected through an inverter 53 to an input terminal 1, and the gate of IG-FET 52 is connected to the output terminal of the inverter 35.

When EN=10V, FET's 31, 34 and 52 are in the OFF state and the output terminal 9 is in a high impedance state. When EN=0V and IN=0V, FET's 31, 32, 34, 51 and 52 are rendered ON, while FET 33 is rendered OFF. Thus the potential on the output terminal 9 becomes +5V. When EN=0V and IN=10V, FET's 31, 33, 34 and 52 are rendered ON, while FET's 32 and 51 are rendered OFF. As a result, the output terminal 9 becomes 0V. Since even in this embodiment the potential on the output terminal 9, immediately before shifted from 0V to +5V, is substantially 0V, a source-to-gate potential of FET 52 becomes greater and the compensation circuit is rendered conductive abruptly. This embodiment, like the above-mentioned embodiments, can sufficiently compensate for a lowering of a rise of the signal on the output terminal 9 resulting from a back gate bias to IG-FET's 31 and 32.

What we claim is:

1. A converter for producing three output states, comprising:

a converter circuit comprising a first potential supply terminal for supplying a first potential, an output terminal, a second potential supply terminal having a second potential smaller in absolute value than said first potential, a first IG-FET (insulated gate field effect transistor) means including at least one IG-FET of a first conductivity type series-connected between said first potential supply terminal and said output terminal and having its substrate electrode supplied with a third potential greater in absolute value than said first potential, a second IG-FET means including at least one IG-FET of a second conductivity type series-connected between said output terminal and said second potential supply terminal and having its substrate electrode supplied with said second potential, and control means receptive to an input signal and at least one control signal and adapted to control said first and second IG-FET means so that said output terminal can take one of said first potential, said second potential and a high impedance state; and a compensation circuit including at least one IG-FET of said second conductivety type series-connected between said first potential supply terminal and said output terminal and having its substrate electrode connected to said output terminal, said compensation circuit being controlled by said control means such that when a potential on said output terminal is shifted from said second potential to said first potential a rise of said first potential is sharpened.

2. A converter producing three output states, comprising:

a converter circuit comprising a first potential supply terminal for supplying a first potential, an output terminal, a second potential supply terminal for supplying a second potential smaller in absolute value than said first potential, a first IG-FET (insulated gate field effect transistor) of a first conductivity type connected between said first potential supply terminal and said output terminal and having its substrate electrode supplied with a third potential greater in absolute value than said first potential, a second IG-FET of a second conductivity type connected between said second potential supply terminal and said output terminal and having its substrate electrode supplied with said second potential, and control means including a NAND gate adapted to receive an input signal and a first control signal and a NOR gate adapted to receive said input signal and a negation signal of said first control signal, said control means adapted to control said first and second IG-FET's such that said output terminal takes one of said first potential, said second potential and a high impedance state; and a compensation circuit connected between said first potential supply terminal and said output terminal and including a third IG-FET of said second conductivity type having its substrate electrode connected to said output terminal, said compensation circuit being controlled by said control means such that when a potential on said output terminal is shifted from said second potential to said first potential a rise of said first potential is sharpened.

3. A converter according to claim 2, in which said first, second and third IG-FET's are a P-channel type, N-channel type and N-channel type, respectively; outputs of said NAND gate and NOR gate are supplied respectively to the gates of said first and second IG-FET's; and said compensation circuit includes an inverter connected between the gate of said third IG-FET and the output of said NAND gate to supply its inverted output to the gate of said third IG-FET.

4. A converter according to claim 2, in which said first, second and third IG-FET's are an N-channel type, P-channel type and P-channel type, respectively; the outputs of said NAND gate and NOR gate are supplied respectively to the gates of said second and first IG-FET's; and said compensation circuit includes an inverter connected between the gate of said third IG-FET and the output of said NOR gate to supply its inverted output to the gate of said third IG-FET.

5. A converter for producing three output states, comprising a converter circuit comprising a first potential supply terminal for supplying a first potential, an output terminal, a second potential supply terminal for supplying a second potential smaller in absolute value than said first potential, a first IG-FET (insulated gate field effect transistor) of a first conductivity type connected between said output terminal and said first potential supply terminal and having its substrate electrode supplied with a third potential greater in absolute value than said first potential, a second IG-FET of a second conductivity type connected between the output terminal and said second potential supply terminal and having its substrate electrode supplied with said second potential, and control means including a NAND gate adapted to receive an input signal and a first control signal and a NOR gate adapted to receive said input signal and a negation signal of said first control signal, said control means being adapted to control said first and second IG-FET's such that said output terminal takes one of said first potential, said second potential and a high impedance state; and a compensation circuit including third and fourth IG-FET's of said second conductivity type series-connected between said first potential supply terminal and said output terminal and having their substrate electrodes connected to said output terminal, said compensation circuit being controlled by said control means such that when a potential on said output terminal is shifted from said second potential to said first potential a rise of said first potential is sharpened.

6. A converter according to claim 5, in which said first, second, third and fourth IG-FET's are a P-channel type, N-channel type, N-channel type and N-channel type, respectively; the outputs of said NAND gate and NOR gate are adapted to be supplied respectively to the gates of said first and second IG-FET's; said first control signal is adapted to be supplied to the gate of said third IG-FET; and said input signal is adapted to be supplied to the gate of said fourth IG-FET.

7. A converter according to claim 5, in which said first, second, third and fourth IG-FET's are an N-channel type, P-channel type, P-channel type and P-channel type, respectively; the outputs of said NAND gate and NOR gate are connected respectively to the gates of said second and first IG-FET's; a negation signal of said first control signal is adapted to be supplied to the gate of said third IG-FET; and said input signal is supplied to the gate of said fourth IG-FET.

8. A converter producing three output states comprising;

a converter circuit comprising a first potential supply terminal for supplying a first potential; an output terminal; a second potential supply terminal having a second potential smaller in absolute value than said first potential; first and second IG-FET's (insulated gate field effect transistor) of a first conductivity type series-connected between said first potential supply terminal and said output terminal and having their substrate electrodes supplied with a third potential greater in absolute value than said first potential; at least a third IG-FET of a second conductivity type series-connected between said second potential supply terminal and said output terminal and having its substrate electrode supplied with said second potential; and control means adapted to receive an input signal and control signal and to control said first, second and third IG-FET's, such that said output terminal takes one of said first potential, said second potential and a high impedance state; and a compensation circuit including fourth and fifth IG-FET's of said second conductivity type series-connected between said first potential supply terminal and said output terminal and having their substrate electrodes connected to said output terminal, said compensation circuit being controlled by said control means such that when a potential on the output terminal is shifted from said second potential to said first potential a rise of said first potential is sharpened.

9. A converter according to claim 8, in which said third IG-FET is of an N-channel type, said first and second IG-FET's are P-channel types; said control means of said converter circuit being receptive to said control signal and input signal and including a NOR gate whose output is supplied to the gates of said second and, third IG-FET's and means for supplying said control signal to the gate of said first IG-FET; said fourth and fifth IG-FET's of said compensation circuit are an N-channel type, and said compensation circuit includes means to supply an inverted signal of said control signal to the gate of said fourth IG-FET and means for supplying said input signal to said fifth IG-FET.

10. A converter according to claim 8 in which said third IG-FET and a sixth IG-FET are both of an N-channel type and are series-connected between said second potential supply terminal and said output terminal of said converter circuit, said first and second IG-FET's being of a P-channel type; said control means of said converter circuit includes a first inverter for supplying an inverted output of said control signal to the gate of said sixth IG-FET, means for supplying said control signal to said first IG-FET, and means for supplying said input signal to the gates of said second and third IG-FET's; the fourth and fifth IG-FET's of said compensation circuit are an N-channel type, and said compensation circuit includes means to send an inverted signal of said input signal to the gate of said fourth IG-FET and means for supplying an ouput of said first inverter to the gate of said fifth IG-FET.

* * * * *